US012676635B2

(12) United States Patent
Liu et al.

(10) Patent No.: US 12,676,635 B2
(45) Date of Patent: *Jul. 7, 2026

(54) CONTROLLER, SYSTEM AND METHOD FOR DECODING CODEWORD BASED ON HISTORICAL INFORMATION

(71) Applicant: InnoGrit Technologies Co., Ltd., Shanghai (CN)

(72) Inventors: Yanfang Liu, San Jose, CA (US); Chenrong Xiong, San Jose, CA (US); Jie Chen, Shanghai (CN)

(73) Assignee: InnoGrit Technologies Co., Ltd., Shanghai (CN)

( * ) Notice: Subject to any disclaimer, the term of this patent is extended or adjusted under 35 U.S.C. 154(b) by 176 days.

This patent is subject to a terminal disclaimer.

(21) Appl. No.: 18/424,623

(22) Filed: Jan. 26, 2024

(65) Prior Publication Data

US 2025/0247111 A1 Jul. 31, 2025

(51) Int. Cl.
*H03M 13/11* (2006.01)
(52) U.S. Cl.
CPC ................................ *H03M 13/1108* (2013.01)
(58) Field of Classification Search
CPC .................................................. H03M 13/1108
See application file for complete search history.

(56) References Cited

U.S. PATENT DOCUMENTS

| | | | | |
|---|---|---|---|---|
| 9,009,578 B1 * | 4/2015 | Varnica | ................. | H03M 13/37 |
| | | | | 714/793 |
| 10,200,064 B1 * | 2/2019 | Varnica | .............. | H03M 13/1108 |
| 11,146,290 B1 * | 10/2021 | Xiong | ................ | H03M 13/1111 |
| 2011/0010600 A1 * | 1/2011 | Gong | ...................... | H04L 1/005 |
| | | | | 714/752 |
| 2015/0082126 A1 * | 3/2015 | Vernon | .............. | H03M 13/1108 |
| | | | | 714/774 |
| 2015/0180511 A1 * | 6/2015 | Ish-Shalom | ........ | H03M 13/1111 |
| | | | | 714/776 |
| 2015/0188570 A1 * | 7/2015 | Kwok | ...................... | G06F 11/08 |
| | | | | 714/764 |
| 2019/0207630 A1 * | 7/2019 | Tate | ...................... | H03M 13/43 |
| 2019/0238158 A1 * | 8/2019 | Bhatia | .................... | G11C 29/52 |
| 2020/0036393 A1 * | 1/2020 | Ha | ...................... | H03M 13/1108 |
| 2020/0259511 A1 * | 8/2020 | Ha | ....................... | G06F 11/1076 |
| 2021/0281278 A1 * | 9/2021 | Lu | ...................... | H03M 13/1111 |

* cited by examiner

*Primary Examiner* — Joseph D Torres
(74) *Attorney, Agent, or Firm* — IPro, PLLC

(57) ABSTRACT

LDPC codewords may be decoded based on historical decoding information. In a decoding iteration, the value of flipping energy of a variable node in a codeword is computed based on information representing decoding of the codeword before the decoding iteration. A comparison result is obtained by comparing the value of flipping energy to a flipping energy threshold. The variable node is flipped in response to the comparison result satisfying a criterion.

15 Claims, 5 Drawing Sheets

S310
IN A DECODING ITERATION, COMPUTING A VALUE OF FLIPPING ENERGY OF A VARIABLE NODE IN A CODEWORD, BASED ON INFORMATION REPRESENTING DECODING OF THE CODEWORD BEFORE THE DECODING ITERATION

S320
OBTAINING A COMPARISON RESULT BY COMPARING THE VALUE OF FLIPPING ENERGY TO A FLIPPING ENERGY THRESHOLD

S330
IN RESPONSE TO THE COMPARISON RESULT SATISFYING A CRITERION, FLIPPING THE VARIABLE NODE

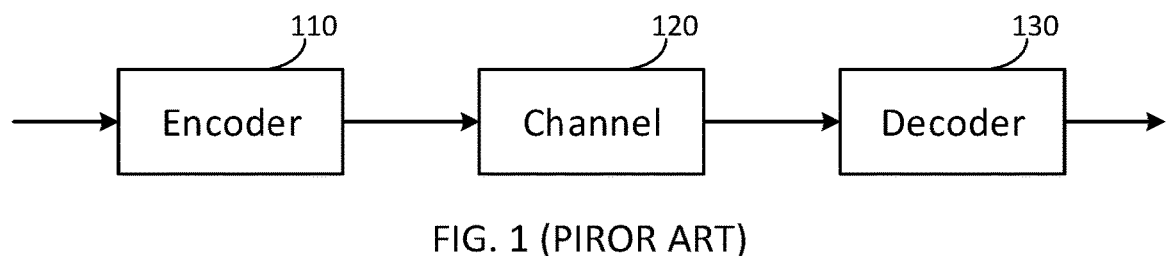
FIG. 1 (PIROR ART)
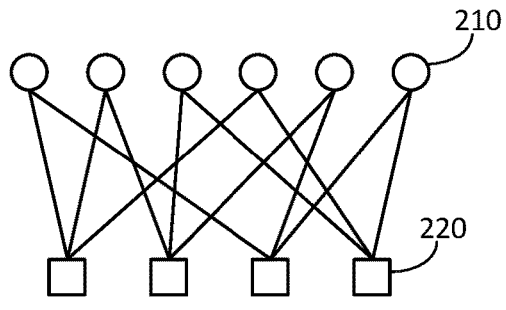
FIG. 2 (PIROR ART)
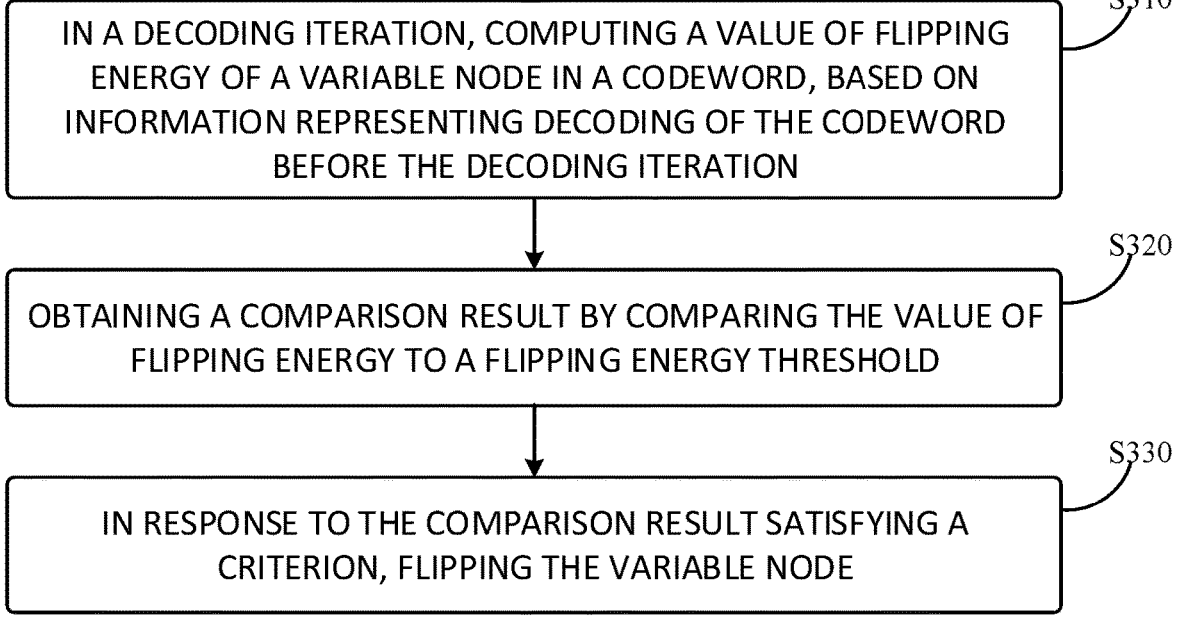
FIG. 3

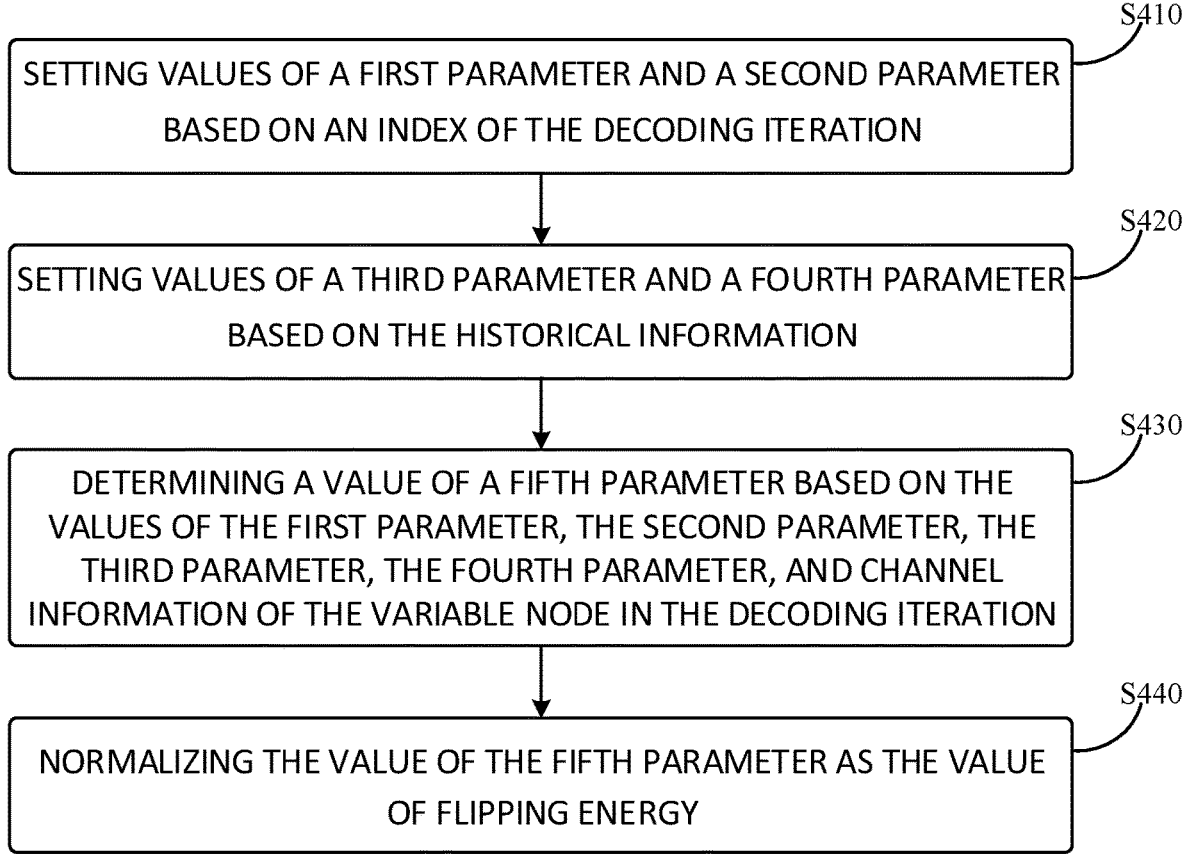

S410

SETTING VALUES OF A FIRST PARAMETER AND A SECOND PARAMETER BASED ON AN INDEX OF THE DECODING ITERATION

S420

SETTING VALUES OF A THIRD PARAMETER AND A FOURTH PARAMETER BASED ON THE HISTORICAL INFORMATION

S430

DETERMINING A VALUE OF A FIFTH PARAMETER BASED ON THE VALUES OF THE FIRST PARAMETER, THE SECOND PARAMETER, THE THIRD PARAMETER, THE FOURTH PARAMETER, AND CHANNEL INFORMATION OF THE VARIABLE NODE IN THE DECODING ITERATION

S440

NORMALIZING THE VALUE OF THE FIFTH PARAMETER AS THE VALUE OF FLIPPING ENERGY

FIG. 4

CONTROLLER, SYSTEM AND METHOD FOR DECODING CODEWORD BASED ON HISTORICAL INFORMATION

TECHNICAL FIELD

The disclosure herein relates to Low-Density Parity Check (LDPC) codes, and more particularly, to a Bit-Flipping (BF) decoding method for LDPC codes, as well as a controller and a system for decoding LDPC codewords by using the Bit-Flipping decoding method.

BACKGROUND

LDPC codes are a family of linear Error Correcting Codes (ECC), suitable for error correction in large block sizes transmitted via very noisy channels due to their near channel capacity error correction capability. Currently, LDPC codes are commonly used in modern Solid-State Drive (SSD) controllers.

A hard-decision Bit-Flipping (BF) decoder is adopted for LDPC code decoding because of its simplicity and efficiency. Compared with traditional belief-propagation (BP) decoding algorithm, BF decoding algorithm has much less complexity but lower performance.

SUMMARY

The present disclosure provides Bit-Flipping (BF) decoding process in which the historical decoding information is considered.

In an exemplary embodiment, there is provided a method that may comprise, in a decoding iteration (or interchangeably an iteration), computing a value of flipping energy of a variable node in a codeword, based on information representing decoding of the codeword before the decoding iteration; obtaining a comparison result by comparing the value of flipping energy to a flipping energy threshold; and in response to the comparison result satisfying a criterion, flipping the variable node.

In another exemplary embodiment, there is provided a controller. The controller may comprise a processor configured to implement the BF decoding method described in the present disclosure.

In yet another exemplary embodiment, there is provided a system. The system may comprise a controller described in the present disclosure. And the system may be a solid-state drive (SSD), a flash drive, a mother board, a processor, a computer, a server, a gaming device, or a mobile device.

In yet another exemplary embodiment, there is provided a non-transitory machine-readable medium having information. The information, when read by a hardware processor system, may cause the hardware processor system to perform the BF decoding method of the present disclosure.

According to the BF decoding process of the disclosure, decoding performance may be increased, and average iteration number may be decreased, and thus, the convergence of BF decoding algorithm may be further speeded up.

BRIEF DESCRIPTION OF FIGURES

FIG. 1 is a schematic diagram illustrating a data transmission system.

FIG. 2 shows a Tanner graph.

FIG. 3 is a flowchart of a process of decoding an LDPC code.

FIG. 4 is a flowchart of a process of computing flipping energy of each variable node during every iteration of BF decoding.

DETAILED DESCRIPTION

Figure 5:
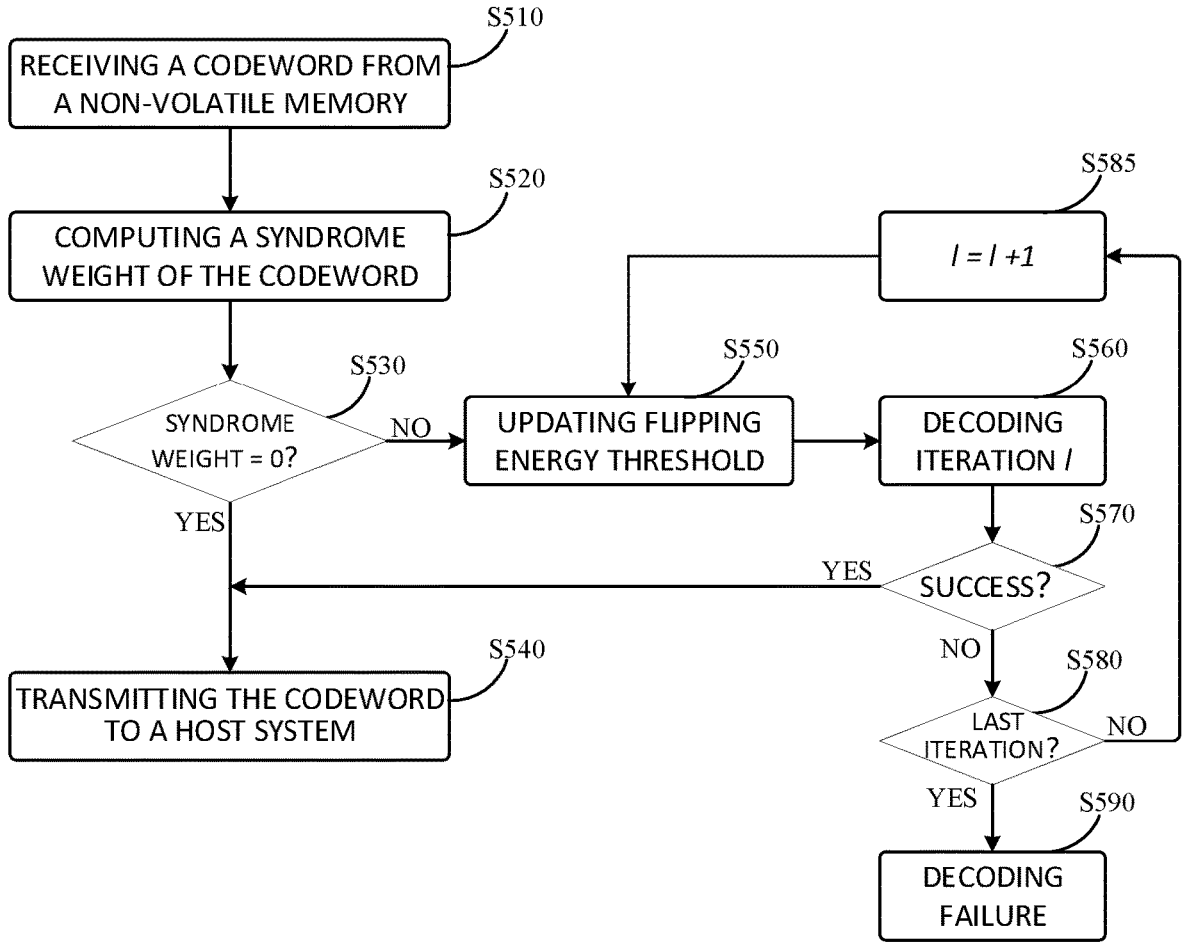
FIG. 5 is a flowchart of a process of LDPC codeword decoding.

Specific embodiments according to the present disclosure will now be described in detail with references to the accompanying figures. Like elements in the various figures are denoted by like reference numerals for consistency.

It should be noted that the decoding method described in the present disclosure is provided in connection with a bit-flipping method for LDPC codes used in an SSD controller. However, it shall not be limiting. Persons of ordinary skill in the art can make modifications or variations under the teaching of the present disclosure and use the decoding method in other decoders or controllers, or decoding other types of code. Such modifications or variations are within the protection scope of the present disclosure.

Provided herein is a bit-flipping decoding method for Low-Density Parity-Check (LDPC) codes, as well as a controller and a system for decoding LDPC codewords by using the bit-flipping decoding method.

FIG. 1 is a schematic diagram illustrating a data transmission system, which may interchangeably be referred to as a decoding system. As shown in FIG. 1, the data transmission system 100 may include an encoder 110, a channel 120, and a decoder 130.

The encoder 110 may be on a transmitter and the decoder 130 may be on a receiver. The encoder 110 may encode input data to generate a codeword using an encoding method (e.g., LDPC encoding).

The encoded codeword may be transmitted to a decoder 130 through a channel 120. The channel 120 may include but not limited to a satellite communication channel using satellite dishes, a wireless communication channel using base stations and/or local antennae, a wired communication channel, a fiber-optic communication channel using electrical to optical (E/O) interface, or any other suitable channel.

The encoded codeword may be decoded by the decoder 130 such that the input data may be recovered. In some embodiments, the encoder 110 and the decoder 130 may correspond to a similar type of code. For example, the encoder 110 and the decoder 130 may both correspond to the LDPC code. In some embodiments, the encoder 110, the channel 120, and/or the decoder 130 may be parts of a solid-state drive (SSD) controller, but this shall not be limiting.

The LDPC codewords may be decoded with a two-dimensional matrix called a parity check matrix. The parity check matrix may define a plurality of variable nodes and check nodes.

An exemplary parity check matrix H may be as below:

$$H = \begin{pmatrix} 1 & 1 & 0 & 1 & 0 & 0 \\ 0 & 1 & 1 & 0 & 1 & 0 \\ 1 & 0 & 0 & 0 & 1 & 1 \\ 0 & 0 & 1 & 1 & 0 & 1 \end{pmatrix}.$$

The parity check matrix H may be prestored in the decoder, or may be received before, after or at the same time when the LDPC codeword are received. The parity check matrix H may be received through the same or different channel as the codeword.

The parity check matrix H may include a plurality of rows (M rows) and a plurality of columns (N columns). Each column of the parity check matrix H may correspond to a variable node, and each row of the parity check matrix H may correspond to a check node. The count N of the columns may be equal to the count of the bits in the received codeword (e.g., N=6). The count M of the rows may be equal to the count of the parity check bits in the received codeword (e.g., M=4). The count k of information bits in the received codeword is k=N−M (e.g., k=2).

For brevity, "bit", "bit node", "variable node" may be used interchangeably in the present disclosure to refer to a binary digit in the codeword or a variable node corresponding to the binary digit defined by the parity check matrix.

In some embodiments, the parity check matrix H may be a regular LDPC check matrix, e.g., the summation of values in each row is a fixed value and the summation of values in each column is also a fixed value.

Alternatively, the parity check matrix H may be an irregular LDPC check matrix, e.g., the summation of values in each row is not a fixed value or the summation of values in each column is not a fixed value.

In some embodiments, the relationship between the variable nodes and the check nodes defined by the parity check matrix H may be illustrated in a Tanner graph (also referred to as a bipartite graph).

FIG. 2 shows an exemplary Tanner graph corresponding to the above exemplary parity check matrix H.

As shown in the Tanner graph, six circles may represent six variable nodes 210 corresponding to the six columns of the parity check matrix, four squares may represent four check nodes 220 corresponding to four rows of the parity check matrix, respectively.

A connection between a variable node 210 and a check node 220 may correspond to a "1" in a corresponding location of the parity check matrix. For example, the "1" in the third row and the fifth column of the parity check matrix may be shown in the Tanner graph as a connection between the fifth variable node 210 and the third check node 220. If a variable node is connected with a check node, the variable node may be deemed as being adjacent to the check node. As shown in FIG. 2, a variable node is adjacent to several check nodes.

The LDPC codeword (or "codeword" for brevity) to be decoded may be expressed as a row vector c=(x, p), wherein x represents k information bits and p represents N check bits. The parity-check equation may be expressed as below:

$$Hc^T=0.$$

Here, in the matrix multiplication computation of $Hc^T$, the addition operation is performed using modulo-2 addition, which is equivalent to the XOR operation.

When a codeword satisfies the parity-check equation, the codeword is deemed as correct.

In order to check whether a codeword c is correct, i.e., the same as a target codeword that is generated in the encoder 110 by encoding the input data, syndrome $s^T=(s_1, s_2, \ldots, s_M)^T$ may be calculated as follow:

$$s^T=Hc^T.$$

If all the calculated syndrome $s^T=(s_1, s_2, \ldots, s_M)^T$ are 0, in other words, a syndrome weight sw which can be defined as a sum of all the syndromes (sw=$s_1$+$s_2$+ . . . +$s_M$) is 0, the codeword is considered to be correct, i.e., the same as the target codeword, and the decoding process is successful.

If any of the calculated syndrome $s^T=(s_1, s_2, \ldots, s_M)^T$ is not 0, in other words, the syndrome weight is not 0, the codeword is considered to be incorrect, i.e., different from the target codeword, and the decoding process is not successful. One or more bits in the codeword (corresponding to the variable nodes) shall be flipped.

In a case that the received codeword is not the same as the target codeword. An iterative decoding process may be performed by iteratively updating the values (i.e., the hard decisions) of the variable nodes 210 until the syndrome weight becomes zero or a maximum count of iterations is reached.

To decide if a variable node will be flipped or not, or to decide which variable node shall be flipped, a threshold is set to be compared with a flipping energy computed for the variable node. A flipping energy is an intermediate parameter computed for a variable node to decide whether the variable node shall be flipped or not.

In other words, during a bit-flipping decoding process, it may be decided whether to flip a variable node based on the flipping energy. For example, if the flipping energy is greater than a threshold, the hard decision of the variable node is flipped; otherwise, the hard decision of the variable node is not flipped.

A flipping energy of each variable node may be computed with the information provided by the adjacent check nodes, i.e., check nodes connected to the variable node.

Flipping energy computation will be described in more detail later.

After flipping, hard decisions of the variable nodes may be accordingly updated, and a syndrome weight associated with the updated hard decisions may be checked again.

The process of updating hard decisions may be iteratively performed until the syndrome weight associated with a specific updated hard decision vector is zero or a preset number of iterations is reached.

Generally, the process of decoding a received codeword may be illustrated with reference to the Tanner graph.

For example, as shown in FIG. 2, the codeword may include six bits corresponding to the six variable nodes 210, and four check bits corresponding to the four check nodes 220.

Initially, each variable node 210 may be assigned an initial value with respect to a corresponding bit of the codeword (e.g., the values in the received codeword). Each variable node 210 may send the corresponding initial value to check nodes 220 connected to it.

The value of a check node 220 may be calculated by modulo-2 addition (XOR) of values of the variable nodes 210 connected to the check node 220, which is equivalent to the computation of a row of the above syndrome formula, $s^T=Hc^T$, and resulting in a corresponding syndrome $s_j$, j=1, 2, . . . , M.

Then, each variable node 210 may be evaluated according to the values of the check nodes connected to it. According to the evaluation result, one or more variable nodes 210 may be flipped to update their values. In the next iteration, each variable node 210 may be further evaluated based on these updated values. The decoder may continuously perform these iterations until the syndrome weight indicates that the most recently updated variable nodes coincide with the target codeword or a preset number of iterations is met.

The bit-flipping decoding method for Low-Density Parity-Check (LDPC) codes will be described with reference to FIG. 3.

FIG. 3 is a flowchart of a process of decoding an LDPC code.

As described above, the decoding process may be performed in several iterations.

As shown in FIG. 3, in a decoding iteration, in step S310, a value of flipping energy of a variable node in a codeword is computed based on information representing decoding of the codeword before the decoding iteration.

In some embodiments, the codeword may be received from a non-volatile memory.

In this disclosure, the information representing decoding of the codeword before the decoding iteration may be referred to as "historical decoding information", or "historical information", or "information". In other words, historical decoding information, for example in previous iteration(s), is used in computing the value of flipping energy of a variable node in the current iteration.

In step S320, a comparison result is obtained by comparing the value of flipping energy to a flipping energy threshold.

In some embodiments, the flipping energy threshold may be updated based on check nodes of the codeword. For example, the flipping energy threshold may be updated based on the check nodes of the codeword at beginning of each iteration.

In step S330, in response to the comparison result satisfying a criterion, the variable node is flipped.

To flip a variable node means to change the value (0 or 1) of a variable node. If the original value of a variable node is 0, it will be flipped to be 1; if the original value of a variable node is 1, it will be flipped to be 0.

In some embodiments, the criterion used in step S330 is that the value of flipping energy is greater than the flipping energy threshold. In other words, if the value of flipping energy of a variable node is greater than the flipping energy threshold, the variable node is flipped.

In some embodiments, a syndrome weight of the codeword is computed. For example, a syndrome weight may be computed in each decoding iteration. In response to the syndrome weight being zero, the codeword may be transmitted to a host system, which means the decoding process is successful.

In some embodiments, in response to the syndrome weight being not zero, the flipping energy threshold may be updated, and the steps S320 and S330 in this decoding iteration may be performed accordingly.

Introducing historical decoding information in the current iteration may lead to a better decoding performance and a lower average iteration number, and thus increases throughputs of the BF decoding algorithm.

Historical decoding information may include but is not limited to: time interval from previous flipping of a variable node (also referred to as "flipping distance"), previous value of flipping energy of a variable node and previous flipped variable node, which will be described in more detail below.

Case 1. Time Interval (Also Referred to as "Flipping Distance").

In some embodiments, the information may include a time interval between the current decoding iteration and a previous decoding iteration in which the variable node was flipped.

This time interval may also be called the flipping distance. This time interval may be expressed by the count of iterations from the previous decoding iteration to the current decoding iteration.

For example, in the current iteration with an index of I (iteration I), the flipping distance or the time interval may be determined for the ith variable node $n_i$ as follow, i=1, 2, . . . , N.

Assuming that variable node $n_i$ was last flipped at an iteration with an index of I' (iteration I'), where I'<I, the time interval (flipping distance) of $n_i$ at iteration I is (I–I').

The index of an iteration (e.g., the current iteration) relates to how many iterations have passed in decoding this codeword before that iteration. The first iteration may have an index of 0, 1 or any suitable value.

Case 2. Previous Value of Flipping Energy of a Variable Node.

In some embodiments, the information may include a previous value of flipping energy of the variable node in a previous decoding iteration. In other words, the information may include the value of the flipping energy of this variable node in the previous decoding iteration. In some embodiments, the previous decoding iteration may be the one immediately before the current decoding iteration.

For example, in the current iteration with an index of I (iteration I), for the ith variable node $n_i$, i=1, 2, . . . , N, the previous decoding iteration is decoding iteration I–1, the information may include the value of flipping energy of variable node $n_i$ computed in decoding iteration I–1.

In some embodiments, the previous decoding iteration may be several previous decoding iterations before the current iteration. The information may include the values of the flipping energy of this variable node in the last several decoding iterations.

For example, in the current iteration with an index of I (iteration I), for the ith variable node $n_i$, i=1, 2, . . . , N, the serval previous decoding iterations may be iteration I–1 to iteration I–q, where q is in range (1, I–1), the information may include the value of flipping energies of $n_i$ respectively computed in iterations from iteration I–1 to iteration I–q.

In some embodiments, the variable node was flipped in the previous decoding iteration. That is to say, the previous decoding iteration is a previous decoding iteration in which the variable node was flipped. In other words, the information may include a previous value of flipping energy of the variable node of a previous decoding iteration in which the variable node was flipped.

For example, in the current iteration with an index of I (iteration I), for the ith variable node $n_i$, i=1, 2, . . . , N, assuming that variable node $n_i$ was flipped at iteration I', where I'<I, the information may include the value of flipping energy of variable node $n_i$ computed at decoding iteration I'.

Case 3. Previous Flipped Variable Node.

For example, given a parity-check matrix H of LDPC codes, flipping energy of a variable node can be computed based on the flipped information of other variable node that adjacent to (or connected with in the corresponding Tanner graph) the same check node as this variable node.

As described above with reference to the parity-check matrix H and the Tanner graph as shown in FIG. 2, a LDPC codeword may include a check node whose value is a parity of a subset of variable nodes of the codeword. In the corresponding Tanner graph, the variable nodes in the same subset connects with (or adjacent to) the same check node.

In some embodiments, the information may include a time interval between the decoding iteration and a previous decoding iteration in which another variable node of the codeword was flipped. Here, the variable node and the other variable node are both in the same subset as described above. In other words, both the variable node and the other variable node connects with (adjacent to) the same check node in the corresponding Tanner graph.

In some embodiments, the information may include a previous value of flipping energy of another variable node of the codeword in a previous decoding iteration. Similarly, the variable node and the other variable node are both in the same subset as described above. In other words, both the variable node and the other variable node connects with (adjacent to) the same check node in the corresponding Tanner graph.

Hereinafter, a process to compute flipping energy of each variable node during every iteration of BF decoding will be described in detail with reference to FIG. 4.

FIG. 4 is a schematic flowchart of a process of computing flipping energy of each variable node during every iteration of BF decoding according to an embodiment of the disclosure.

In some embodiments, flipping energy of a variable node is adjusted by combining channel information and historical decoding information e.g., flipping distance.

For every variable node, the input for the process of computing flipping energy may include an index of the current iteration, channel information and historical decoding information (e.g., flipping distance), and the output is the flipping energy.

Further, two integer parameters may also be preset to be used in the process, an iteration index threshold m and a normalizing constant z.

In step 410, values of a first parameter a and a second parameter b can be set based on an index I of the current decoding iteration.

The first parameter a and the second parameter b may also be referred to as "coefficients a and b".

As mentioned above, the index I of an iteration (e.g., the current iteration) relates to how many iterations have passed in decoding this codeword before that iteration. The first iteration may have an index of 0, 1 or any suitable value.

In some embodiments, the values of the first parameter a and the second parameter b may be set by comparing the index I of the decoding iteration to an iteration index threshold m which can be set previously.

For example, if the index I of the current iteration is greater than the iteration index threshold m, i.e., I>m, the first parameter a can be set greater than the second parameter b, i.e., a>b. Here, a and b may be any values that satisfy the condition a>b.

Otherwise, if the index I of the current iteration is not greater than the iteration index threshold m, i.e., I<m, the first parameter a can be set smaller than the second parameter b, i.e., a<b. Here, a and b may be any values that satisfy the condition a<b.

In step 420, values of a third parameter $v_1$ and a fourth parameter $v_2$ can be set based on the historical information.

The third parameter $v_1$ and the fourth parameter $v_2$ may also be referred to as "offsets $v_1$ and $v_2$".

The two offsets $v_1$ and $v_2$ may be derived according to the historical information, e.g., the flipping distance:

$$v_1 = f_1(\text{historical information}), \text{ and}$$

$$v_2 = f_2(\text{historical information}).$$

Here, $f_1$ and $f_2$ represent that $v_1$ and $v_2$ are functions of historical information and are derived from historical information.

In step 430, a value of a fifth parameter d can be determined based on the values of the first parameter a, the second parameter b, the third parameter $v_1$, the fourth parameter $v_2$, and channel information of the variable node in the decoding iteration.

In some embodiments, in determining the value of the fifth parameter d, it is further determined whether channel mismatch is presence based on the channel information.

Channel information of a variable node is the received value of this variable node after channel transmission. Channel mismatch happens when the current value of a variable node is not equal to the received value of this variable node. And thus, channel information may be applied to decide if channel mismatch happens.

In some embodiments, the fifth parameter d may be determined in different way depending on whether channel mismatch is presence.

For example, if channel mismatch happens, the fifth parameter d may be determined based on the first parameter a, the second parameter b, the third parameter $v_1$ and the number g of unsatisfied check nodes connected with this variable node at the current iteration:

$$d = a + b \times g - v_1.$$

Otherwise, if channel mismatch does not happen, the fifth parameter d may be determined based on the second parameter b, the fourth parameter $v_2$ and the number g of unsatisfied check nodes connected with this variable node at the current iteration:

$$d = b \times g - v_2.$$

In step 440, the value of the fifth parameter d may be normalized as the value of flipping energy.

For example, the fifth parameter d may be divided by a normalizing constant z, to generate the flipping energy d/z.

Then, the flipping energy d/z may be output for every variable node as a computing result of this process as shown in FIG. 4.

In the process of computing the flipping energy d/z, the following parameters can be adjusted: the first parameter a and the second parameter b; the iteration index threshold m; the historical information; the third parameter $v_1$ and the fourth parameter $v_2$; and the normalizing constant z.

The goal is to increase decoding performance of BF decoding algorithm and to decrease average iteration number used to decode codewords.

The above parameters may be optimized for the above goals.

In the process shown in FIG. 4, the first and second parameters a and b, channel mismatch, and historical information (e.g., flipping distance) used to decide the third and fourth parameters (offsets) $v_1$ and $v_2$, and normalizing constant z are introduced.

The first and second parameters a and b may be adjusted according to iteration index threshold m, for example, in the above step S410.

Channel mismatch is adopted in the process of computing flipping energy, for example, in determining the fifth parameter d in the above step S430. Further, channel mismatch information may also be adopted in setting the third parameter $v_1$ and the fourth parameter $v_2$, for example, in the above step S420. In some embodiments, when channel mismatch happens, the third $v_1$ decreases as the flipping distance increases, while the fourth parameter $v_2$ increases as the flipping distance increases.

In the above step S440, the fifth parameter d is divided by the normalizing constant z. In some embodiments, the value of the normalizing constant z may be decided by the first parameter a and the second parameter b.

Below is an example of a set of the above parameters, in which flipping distance (or time interval) as described above is applied as historical decoding information.

In this example, it is assumed that number of unsatisfied check nodes g=2, iteration index threshold m=2, normalizing constant z=3.

If the current iteration index I>m, the first parameter a=4, the second parameter b=3. Otherwise, if the current iteration index I<m, the first parameter a=3, the second parameter b=4.

The third parameter $v_1$ and the fourth parameter $v_2$ may be set as follow:

$$v_1 = \begin{cases} 2 & \text{if flipping distance} < 5 \\ 3 & \text{if } 5 \leq \text{flipping distance} \leq 25, \text{ and} \\ 4 & \text{if flipping distance} > 25 \end{cases}$$

$$v_2 = \begin{cases} 4 & \text{if flipping distance} < 5 \\ 3 & \text{if } 5 \leq \text{flipping distance} \leq 25. \\ 1 & \text{if flipping distance} > 25 \end{cases}$$

Here, the computation of flipping energy for iteration 1 is taken as an example, 1<m.

If channel mismatch happens, flipping energy is computed by $d/z=(a+b\times g-v_1)/z$. It can be found that:

flipping energy is 3 if flipping distance<5;
flipping energy is 2.67 if 5≤flipping distance≤25; and
flipping energy is 2.33 if flipping distance>25.

If no channel mismatch happens, flipping energy is computed by $d/z=(b\times g-v_2)/z$. It can be found that:

flipping energy is 1.33 if flipping distance<5;
flipping energy is 1.67 if 5≤flipping distance≤25; and
flipping energy is 2.33 if flipping distance>25.

In some embodiments, the flipping energy may be represented by the integer portion of d/z or by rounding d/z.

In some embodiments, in order to further decrease the cost of hardware, flipping distance is divided by n, where n may be decided by bit-width of maximum iteration number. In this case, n may be 2 or 4. By dividing the flipping distance, the flipping distance can be represented with less bits.

For example, if the maximum iteration number equals to 40, the largest flipping distance can be 39, which requires 6 bits to store. If the flipping distance is divided by 2, the largest flipping distance will require only 5 bits to store. If the flipping distance is divided by 4, the largest flipping distance will require only 4 bits, and so on.

Hereinafter, an example of LDPC codeword decoding process will be described with reference to FIG. 5.

FIG. 5 is a schematic flowchart of an exemplary process of LDPC codeword decoding according to an embodiment of the disclosure.

As shown in FIG. 5, in step S510, a codeword can be received from a non-volatile memory.

FIG. 5 shows an embodiment in which codeword received from a non-volatile memory is decoded, and then transmitted to a host system. It shall be understood that the disclosure shall not be limited by this. The codeword to be decoded can be received from any suitable data source, and the decoded codeword can be transmitted to any suitable destination.

In step S520, a syndrome weight sw of the codeword may be computed, as described above.

In step S530, it is determined whether the computed syndrome weight sw equals to 0.

If the computed syndrome weight sw equals to 0, the decoding process is successful, and the process turns into step S540.

In step S540, the codeword may be transmitted to a host system. As mentioned above, in other embodiments, the codeword may be transmitted to any suitable destination.

If the computed syndrome weight sw is not to 0, the process turns into step S550.

In step S550, a flipping energy threshold may be updated, for example, based on check nodes of the codeword.

And in step S560, a decoding iteration with an index of I is performed. The index I can begin from 0, 1 or any other suitable value.

The decoding iteration may include the steps shown in FIG. 3 and described above. The value of flipping energy of respective variable node in the codeword is computed based on historical decoding information and compared with a flipping energy threshold. The variable node may be flipped in response to the comparison result satisfying a criterion, for example, the computed value of flipping energy is greater than the flipping energy threshold.

In step S560, the variable nodes may be processed one by one, or may be processed in groups.

If the variable nodes are processed one by one, the syndrome weight of the codeword is computed when a variable node is flipped and is then compared with 0 to determine whether the decoding process is successful.

If the variable nodes are processed in groups, values of flipping energies of a group of variable nodes are computed respectively and compared with the flipping energy threshold. And the syndrome weight of the codeword is computed if any of the group of variable nodes is flipped and is then compared with 0 to determine whether the decoding process is successful.

A new syndrome weight sw may be computed for the codeword with flipped variable node. If the new syndrome weight sw is 0, the decoding process is successful as determined in step S570, and the process turns into step S540.

If it is not successful as determined in step S570, the process turns into step S580, and it is determined whether the current decoding iteration is last iteration. For example, an iteration index threshold m can be pre-set. If the index I of current decoding iteration equals m, i.e., I=m, which means that current decoding iteration is the last iteration, the process turns into step S590, and the decoding process fails.

If I<m, which means that current decoding iteration is not the last iteration, the process turns into step S585, increasing I by 1, i.e., I=I+1. The process turns into step S550, and a new decoding iteration begins, for example, by updating flipping energy threshold.

Figure 6:
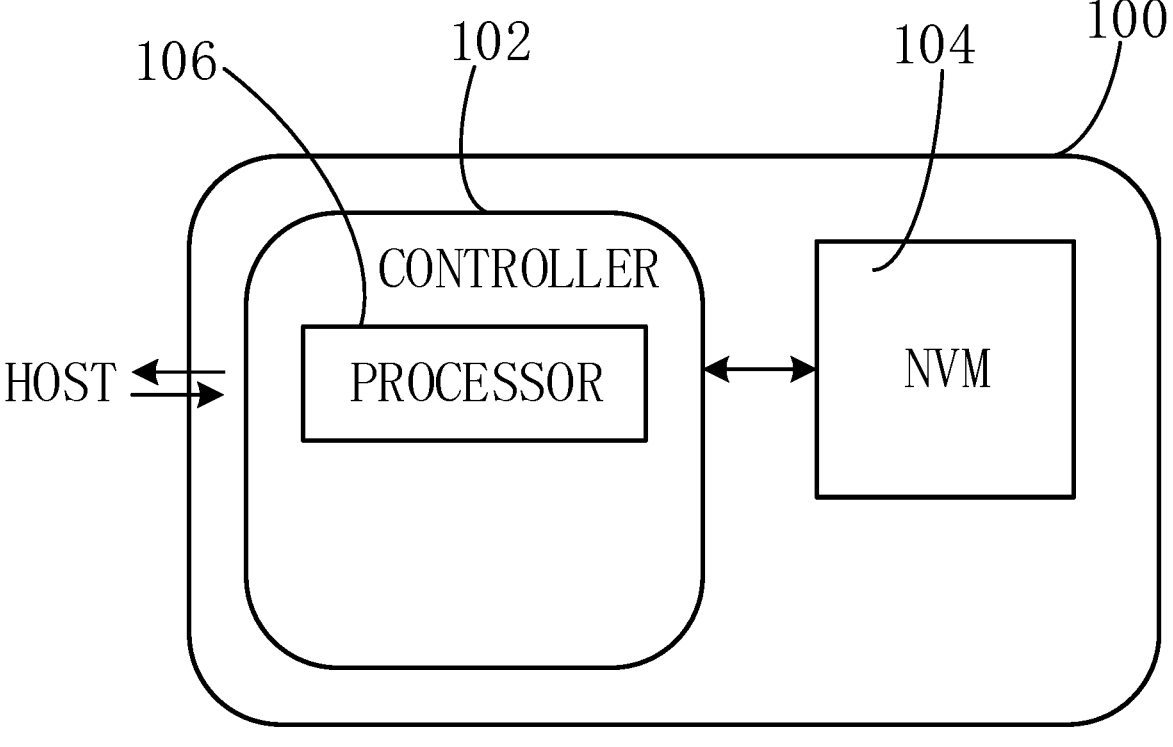
FIG. 6 schematically shows a data transmission system.

FIG. 6 schematically shows a system in accordance with an embodiment of the present disclosure.

For example, the system might be a solid-state drive (SSD), a flash drive, a mother board, a processor, a computer, a server, a gaming device, or a mobile device.

As shown in FIG. 6, the system 100 may include a controller 102.

The controller 102 may include a processor 106. The processor 106 may be configured to implement the method as described in this disclosure.

Further, in some embodiments, the system 100 may further include a non-volatile memory (NVM) 104. LDPC codeword received from the NVM 104 may be decoded by the processor 106 by implementing the decoding method described in this disclosure, and then transmitted to a host.

In an embodiment, there is provided a controller. The controller includes a processor configured to implement the method as described in this disclosure.

In another embodiment, there is provided a system. The system includes a controller of the disclosure. And, the system may be a solid-state drive (SSD), a flash drive, a mother board, a processor, a computer, a server, a gaming device, or a mobile device.

In yet another embodiment, there is provided a non-transitory machine-readable medium having information, wherein the information, when read by a hardware processor system, causes the hardware processor system to perform the method as described in this disclosure.

Simulations are performed for BF decoding processes according to the disclosure and the original BF decoding. From the simulation results, it can be seen that the BF decoding process described in the disclosure has superior performance. Additionally, it requires smaller number of decoding iterations, indicating higher efficiency in error correction and decoding accuracy.

Figure 7:
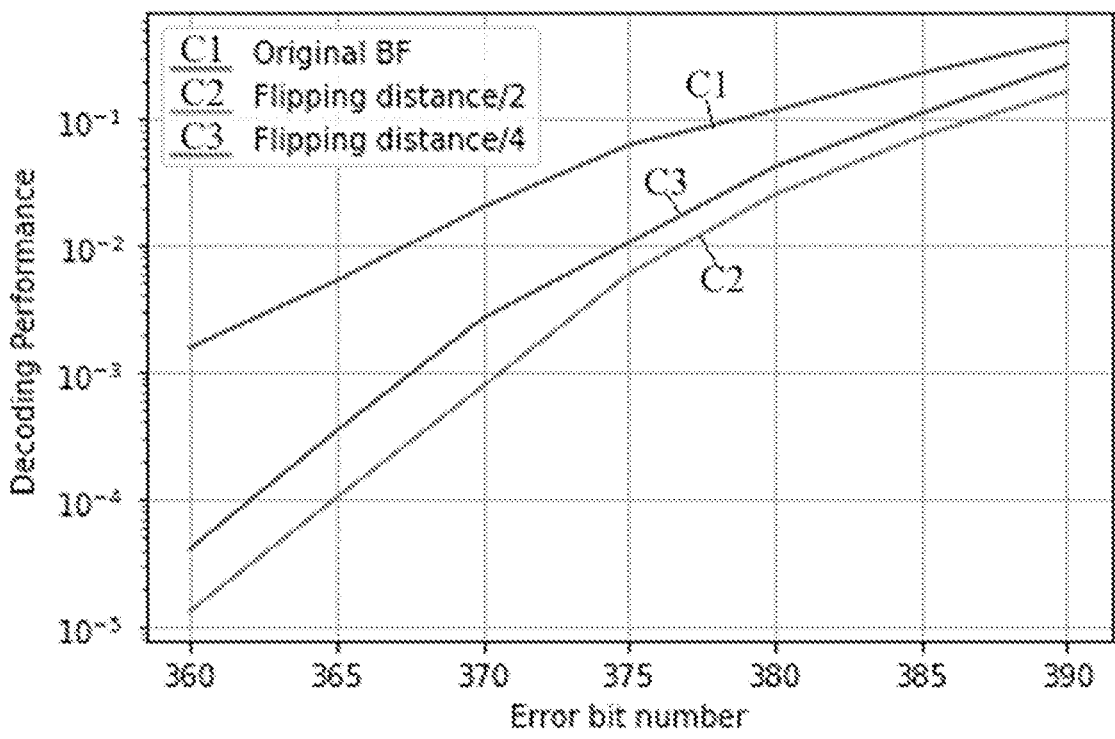
FIG. 7 shows simulation results of decoding performances of BF decoding processes.

FIG. 7 shows simulation results of decoding performances of the BF decoding processes.

Curve C1 illustrates the relationship between decoding performance and number of error bits in original BF decoding process. Curve C2 illustrates the relationship between decoding performance and number of error bits in the decoding process of the disclosure in which the flipping distance is divided by 2 (n=2). Curve C3 illustrates the relationship between decoding performance and number of error bits in the decoding process of the disclosure in which the flipping distance is divided by 4 (n=4).

It can be seen from FIG. 7 that curve C2 and C3 shows better decoding performance than curve C1, and curve C2 is better than curve C3 at a cost of one more bit to store the flipping distance.

Figure 8:
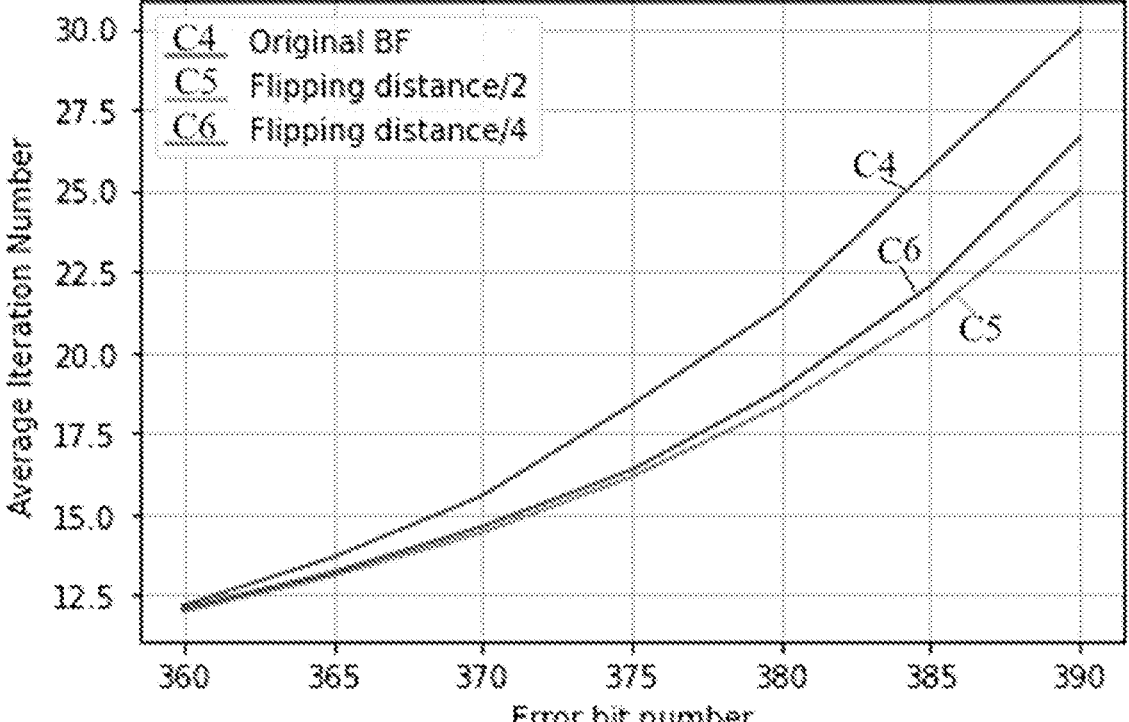
FIG. 8 shows simulation results of average iteration numbers of the BF decoding processes.

FIG. 8 shows simulation results of average iteration numbers of the BF decoding processes.

Curve C4 illustrates the relationship between the average iteration number and number of error bits in original BF decoding process. Curve C5 illustrates the relationship between the average iteration number and number of error bits in the decoding process of the disclosure in which the flipping distance is divided by 2 (n=2). Curve C6 illustrates the relationship between the average iteration number and number of error bits in the decoding process of the disclosure in which the flipping distance is divided by 4 (n=4).

It can be seen from FIG. 8 that the process of the disclosure (curve C5 and C6) requires less average iteration number than the original BF decoding process, and curve C5 requires smaller average iteration number than curve C6 at a cost of one more bit to store the flipping distance.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method comprising:
in a decoding iteration, computing a value of flipping energy of a variable node in a codeword, based on information representing decoding of the codeword before the decoding iteration;
obtaining a comparison result by comparing the value of flipping energy to a flipping energy threshold; and
in response to the comparison result satisfying a criterion, flipping the variable node;
wherein computing the value of flipping energy comprises:
setting values of a first parameter and a second parameter based on an index of the decoding iteration;
setting values of a third parameter and a fourth parameter based on the information;
determining a value of a fifth parameter based on the values of the first parameter, the second parameter, the third parameter, the fourth parameter, and channel information of the variable node in the decoding iteration; and
normalizing the value of the fifth parameter as the value of flipping energy.

2. The method of claim 1, wherein the information comprises a time interval between the decoding iteration and a previous decoding iteration in which the variable node was flipped.

3. The method of claim 1, wherein the information comprises a previous value of flipping energy of the variable node in a previous decoding iteration.

4. The method of claim 3, wherein the variable node was flipped in the previous decoding iteration.

5. The method of claim 1, wherein the information comprises a time interval between the decoding iteration and a previous decoding iteration in which another variable node of the codeword was flipped; wherein the codeword comprises a check node whose value is a parity of a subset of variable nodes of the codeword and the variable node and the other variable node are both in the subset.

6. The method of claim 1, wherein the information comprises a previous value of flipping energy of another variable node of the codeword in a previous decoding iteration; wherein the codeword comprises a check node whose value is a parity of a subset of variable nodes of the codeword and the variable node and the other variable node are both in the subset.

7. The method of claim 1, wherein setting the values of the first parameter and the second parameter based on the index of the decoding iteration comprises comparing the index to an iteration index threshold.

8. The method of claim 1, wherein determining the value of the fifth parameter comprises determining whether channel mismatch is presence based on the channel information.

9. The method of claim 1, wherein the criterion is that the value of flipping energy is greater than the flipping energy threshold.

10. The method of claim 1, further comprising updating the flipping energy threshold based on check nodes of the codeword.

11. The method of claim 1, further comprising computing a syndrome weight of the codeword; in response to the syndrome weight being zero, transmitting the codeword to a host system.

12. The method of claim 1, further comprising receiving the codeword from a non-volatile memory.

13. A controller, comprising a processor configured to implement the method of claim 1.

14. A system, comprising the controller of claim 13, wherein the system is a solid-state drive (SSD), a flash drive, a mother board, a processor, a computer, a server, a gaming device, or a mobile device.

15. A non-transitory machine-readable medium having information, wherein the information, when read by a hardware processor system, causes the hardware processor system to perform the method of claim 1.

* * * * *